United States Patent
Malek et al.

(10) Patent No.: US 9,974,180 B2
(45) Date of Patent: May 15, 2018

(54) COMPONENT PROTECTION STRUCTURES FOR ELECTRONIC DEVICES

(71) Applicant: Apple Inc., Cupertino, CA (US)

(72) Inventors: Shayan Malek, San Jose, CA (US); David A. Pakula, San Francisco, CA (US); Gregory N. Stephens, Sunnyvale, CA (US); Sawyer I. Cohen, Sunnyvale, CA (US); Scott A. Myers, San Francisco, CA (US); Tyler B. Cater, Cupertino, CA (US); Eric W. Bates, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 147 days.

(21) Appl. No.: 14/801,686

(22) Filed: Jul. 16, 2015

(65) Prior Publication Data
US 2016/0066438 A1   Mar. 3, 2016

Related U.S. Application Data

(60) Provisional application No. 62/045,386, filed on Sep. 3, 2014.

(51) Int. Cl.
*G06F 1/16* (2006.01)
*H05K 1/18* (2006.01)

(52) U.S. Cl.
CPC .......... *H05K 1/181* (2013.01); *G06F 1/1658* (2013.01); *H05K 2201/10151* (2013.01); *H05K 2201/10219* (2013.01); *H05K 2201/10598* (2013.01); *Y02P 70/611* (2015.11)

(58) Field of Classification Search
None
See application file for complete search history.

(56) References Cited

U.S. PATENT DOCUMENTS

| | | | | |
|---|---|---|---|---|
| 5,043,845 A | * | 8/1991 | McDermott | .......... H01L 31/024 174/16.3 |
| 7,197,951 B2 | | 4/2007 | Koyama et al. | |
| 8,847,372 B1 | * | 9/2014 | Darveaux | ............... H01L 21/56 257/678 |
| 8,900,188 B2 | | 12/2014 | Blumberg, Jr. et al. | |
| 8,963,841 B2 | | 2/2015 | Brooks et al. | |
| 2005/0252300 A1 | * | 11/2005 | Miller | ................... G01L 9/0058 73/715 |

(Continued)

*Primary Examiner* — Courtney Smith
*Assistant Examiner* — Rashen E Morrison
(74) *Attorney, Agent, or Firm* — Treyz Law Group, P.C.; G. Victor Treyz; David K. Cole

(57) ABSTRACT

An electronic device may have a printed circuit to which electrical components are mounted. The electrical components may include a thermal sensor and a pressure sensor. A through hole in the printed circuit may receive the shaft of a standoff. The standoff may be soldered to plated metal on the sides of the through hole. A screw or other fastener may secure the printed circuit to a housing for the electronic device. A ring-shaped metal member may be soldered to the printed circuit. The ring-shaped metal member may form a bumper that surrounds the screw or other fastener and the thermal sensor. The pressure sensor may have a port through which ambient pressure measurements are made. A dust protection cover such as a fabric or other porous layer may cover the port.

19 Claims, 11 Drawing Sheets

(56) References Cited

U.S. PATENT DOCUMENTS

| | | | |
|---|---|---|---|
| 2006/0019510 A1* | 1/2006 | Rudduck | F16B 1/0014 439/74 |
| 2011/0255250 A1* | 10/2011 | Dinh | G03B 15/03 361/749 |
| 2013/0044444 A1 | 2/2013 | Creighton et al. | |
| 2013/0077257 A1* | 3/2013 | Tsai | G06F 1/20 361/720 |
| 2013/0107141 A1* | 5/2013 | Minaguchi | H05K 5/02 348/836 |
| 2014/0112510 A1* | 4/2014 | Yang | H04R 1/021 381/332 |
| 2014/0152890 A1* | 6/2014 | Rayner | G06F 1/1626 348/376 |
| 2014/0331741 A1* | 11/2014 | Shah | G01N 3/30 73/12.06 |
| 2015/0070864 A1* | 3/2015 | Rainer | H01L 21/563 361/782 |
| 2015/0243937 A1 | 8/2015 | Dinh et al. | |
| 2015/0244121 A1* | 8/2015 | Amelio | H01R 24/78 439/345 |
| 2015/0296607 A1* | 10/2015 | Yang | G01L 1/205 361/750 |
| 2015/0296622 A1* | 10/2015 | Jiang | G01L 1/2268 361/750 |
| 2016/0081193 A1* | 3/2016 | Leggett | H05K 7/1427 361/749 |
| 2017/0030784 A1* | 2/2017 | Mason | G01L 3/1457 |

* cited by examiner

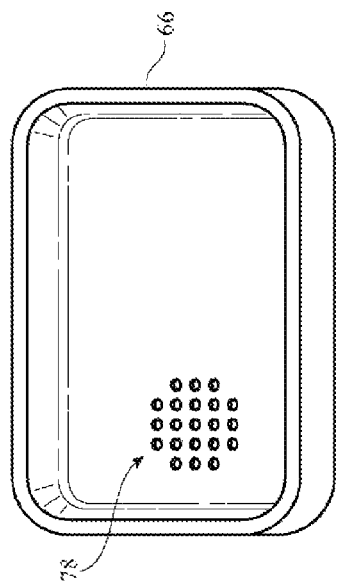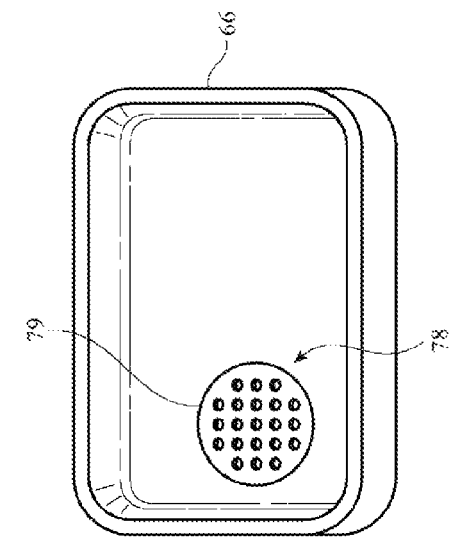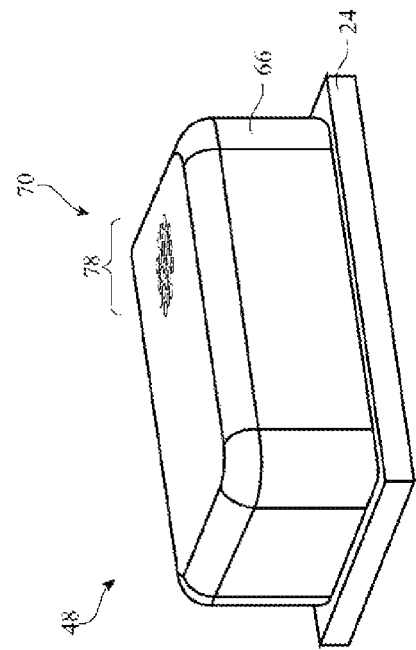

COMPONENT PROTECTION STRUCTURES FOR ELECTRONIC DEVICES

This application claims the benefit of provisional patent application No. 62/045,386 filed on Sep. 3, 2014, which is hereby incorporated by reference herein in its entirety.

BACKGROUND

This relates generally to electronic devices, and, more particularly, electronic devices that include electrical components.

Electronic devices include electronic components such as integrated circuits, sensors, and other circuitry. Electronic components may be mounted on printed circuit boards. A printed circuit hoard may be attached to a device housing using screws.

If care is not taken, components can be damaged during use of an electronic device. Components may be bumped during assembly. During use of a device, drop events and other activities may impart stresses on device components and printed circuit boards. Dust particles may become dislodged within the interior of a device or may intrude into the device through a connector port. In the presence of contaminants and stress, there is a risk that device components might not perform satisfactorily and that components and printed circuits might become damaged.

It would therefore be desirable to be able to provide improved electronic device structures for protecting printed circuits and components mounted to printed circuits.

SUMMARY

An electronic device may have a housing with an interior. A display may be mounted to the housing. A printed circuit may be mounted in the interior of the housing. Electrical components may be mounted to the printed circuit. The electrical components may include a thermal sensor, a pressure sensor, integrated circuits, and other circuitry.

A through hole in the printed circuit may receive the shaft of a standoff. The standoff shaft may be soldered to plated metal on the sides of the through hole. A screw or other fastener may pass through an opening in the standoff to secure the standoff and the printed circuit to the electronic device housing or other support structure within the electronic device.

A screw or other fastener in the vicinity of the thermal sensor may secure the printed circuit to the housing using the standoff or a through hole in the printed circuit board. A ring-shaped metal member may be soldered to the printed circuit. The ring-shaped metal member may form a bumper that surrounds the screw and the thermal sensor to help stiffen the printed circuit in the vicinity of the thermal sensor.

The pressure sensor may have a port through which ambient pressure measurements are made. A dust protection cover such as a fabric or other porous layer may cover the port. A ring of adhesive may attach the fabric to a body portion of the pressure sensor.

BRIEF DESCRIPTION OF THE DRAWINGS

FIG. 9 is a perspective view of an illustrative electronic component with a porous port cover formed from a cluster of perforations such as laser-drilled holes in accordance with an embodiment.

FIG. 10 is an interior view of the cluster of perforations of FIG. 9 in accordance with an embodiment.

FIG. 11 is an interior view of the cluster of perforations of FIG. 9 formed in a structure with a locally thinned portion overlapping the cluster in accordance with an embodiment.

DETAILED DESCRIPTION

Figure 1:
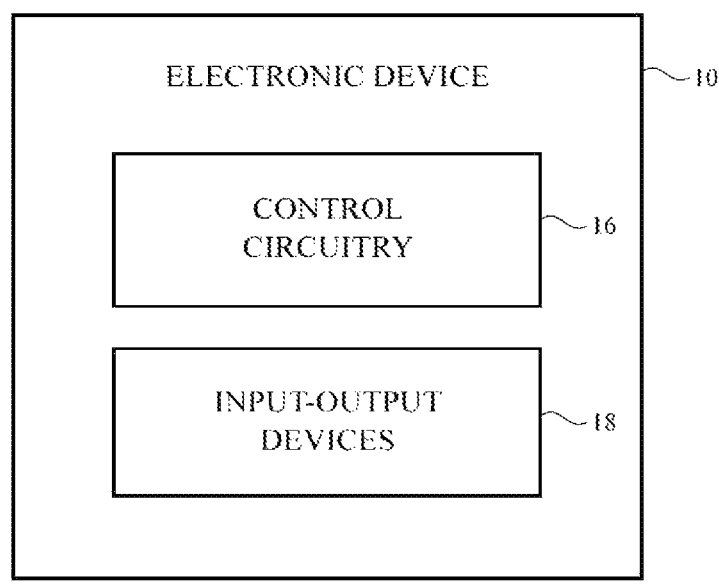
FIG. 1 is a schematic diagram of an illustrative electronic device in accordance with an embodiment.

An illustrative electronic device is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors and other wireless communications circuits, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors such as touch sensors, proximity sensors, ambient light sensors, compasses, gyroscopes, accelerometers, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays. Device 10 may, for example, include a touch screen display that includes a touch sensor for gathering touch input from a user or a display that is insensitive to touch. A touch sensor for a display in device 10 may be based on an array of capacitive touch sensor electrodes, acoustic touch sensor structures, resistive touch components, force-based touch sensor structures, a light-based touch sensor, or other suitable touch sensor arrangements.

Power for device 10 may be provided by an external source of power and/or an internal battery. The components for device 10 such as circuitry 16 and devices 18 and other structures in device 10 may be implemented using integrated circuits, discrete components (e.g., resistors, capacitors, inductors), microelectromechanical systems (MEMS) devices, portions of housing structures, packaged parts, and other devices and structures.

Control circuitry 16 may be used to run software on device 10 such as operating system code and applications. During operation of device 10, the software running on control circuitry 16 may display images for a user on one or more displays and may use other internal components such as input-output devices 18. Device 10 may use communications circuits to send and receive wireless and wired data. For example, device 10 may use light-emitting components to transmit data and may use light-receiving components to receive transmitted light signals. Device 10 may also use light-emitting, components, light-receiving components, audio components, capacitive sensors, microelectromechanical systems devices, and other components as sensors and output devices. Device 10 may use wireless circuits in circuitry 16 (e.g., a baseband processor and associated radio-frequency transceiver circuitry) to transmit and receive wireless signals. For example, device 10 may transmit and receive cellular telephone signals and/or wireless local area network signals or other wireless data.

Figure 2:
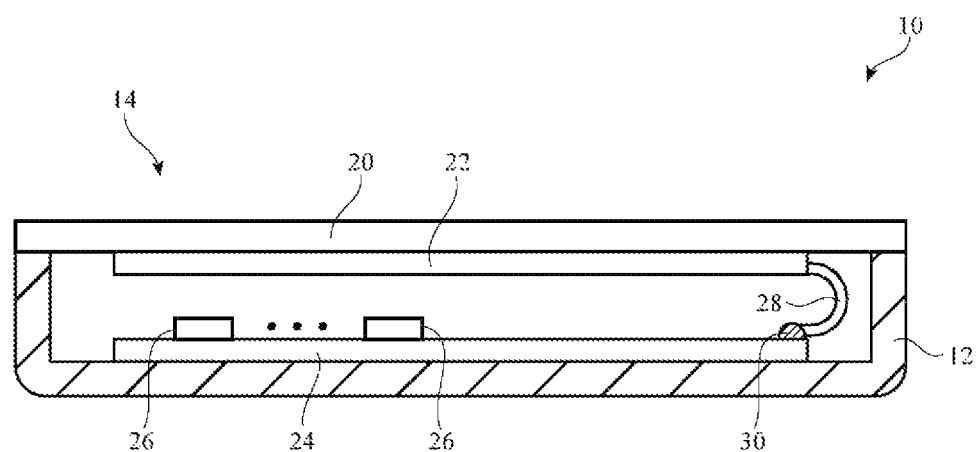
FIG. 2 is a cross-sectional side view of an illustrative electronic device in accordance with an embodiment.

A cross-sectional side view of art illustrative electronic device is shown in FIG. 2. As shown in FIG. 2, device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Device 10 may have inner housing structures that provide additional structural support to device 10 and/or that serve as mounting platforms for printed circuits and other structures. Structural internal housing members may sometimes be referred to as housing structures and may be considered to form part of housing 12.

Device 10 may have a display such as display 14. Display 14 may be a touch screen display that incorporates a layer of conductive capacitive touch sensor electrodes or other touch sensor components (e.g., resistive touch sensor components acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 of device 10 may be formed from a display module such as display module 22 mounted under a cover layer such as display cover layer 20 (as an example). Display 14 (display module 22) may be a liquid crystal display, an organic light-emitting diode display, a plasma display, an electrophoretic display, a display that is insensitive to touch, a touch sensitive display that incorporates and array of capacitive touch sensor electrodes or other touch sensor structures or may be any other type of suitable display. Display cover layer 20 may be planar or curved and may be formed from clear glass, a transparent plastic member, a transparent crystalline member such as a sapphire layer, clear ceramics, other transparent materials, or combinations of these structures.

Electrical components 26 may be mounted within the interior of housing 12. Components 26 may be mounted to printed circuits such as printed circuit 24 within the interior of housing 12. Printed circuit 24 may be a rigid printed circuit board (e.g., a printed circuit hoard formed from fiberglass-filled epoxy or other rigid printed circuit board material) or may be a flexible printed circuit (e.g., a printed circuit firmed from a sheet of polyimide or other flexible polymer layer). Patterned metal traces within printed circuit board 24 may be used to form signal paths between components 26. If desired, components such as connectors may be mounted to printed circuit 24. As shown in FIG. 2, for example, a cable such as flexible printed circuit cable 28 may couple display module 22 to connector 30. Connector 30 may couple cable 28 to traces within printed circuit 24. When coupled as shown in FIG. 2, signals associated with operation of display 14 may pass to display module 22 from signal lines in printed circuit 24 through cable 28 and connector 30.

Figure 3:
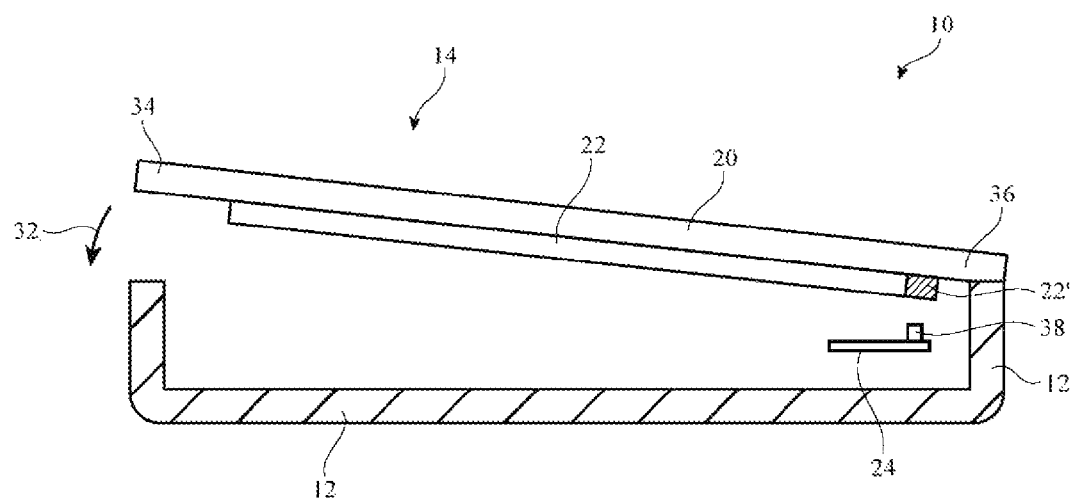
FIG. 3 is a side view of an illustrative electronic device during assembly in accordance with an embodiment.

There is sometimes a risk of component damage during device assembly. Consider, as an example, the illustrative configuration for device 10 that is shown in FIG. 3. In the arrangement of FIG. 3, device 10 has a housing such as housing 12 into which display 14 is being mounted. Electrical components may be mounted to printed circuit 24. For example, thermal sensor 38 may be mounted to printed circuit board 24. During normal operation of device 10, thermal sensor 38 may monitor the temperature of adjacent components such as light-emitting diodes 22 in a backlight unit in liquid crystal display module 22. Light-emitting diodes 22' may be used to supply backlight for the liquid crystal display module or other display module 22 in display 14. Sensor 38 may be a solid state sensor or other temperature sensor.

For satisfactory performance, it may be desirable to leave a component such as thermal sensor 38 uncovered. By foregoing a cover for sensor 38, sensor 38 may be used to accurately sense the temperature of adjacent component 22'. The presence of intervening structures between sensor 38 and component 22' might prevent heat generated by component 22' from reaching sensor 38.

In a configuration in which sensor 38 is not covered, there is a potential that sensor 38 may be bumped during device assembly. In a configuration of the type shown in FIG. 3, a display assembly containing display 14 may be installed within housing 12 by attaching end 36 to housing 12 and then rotating end 34 of display 14 into housing 12 in direction 32 (where screws may be used to finish the assembly process). During this process, portions of the display assembly (e.g., portions near end 36) may potentially bump into sensor 38 and damage sensor 38. For example, sensor 38 may be damaged or sensor 38 may be dislodged from printed circuit 24.

Figure 4:
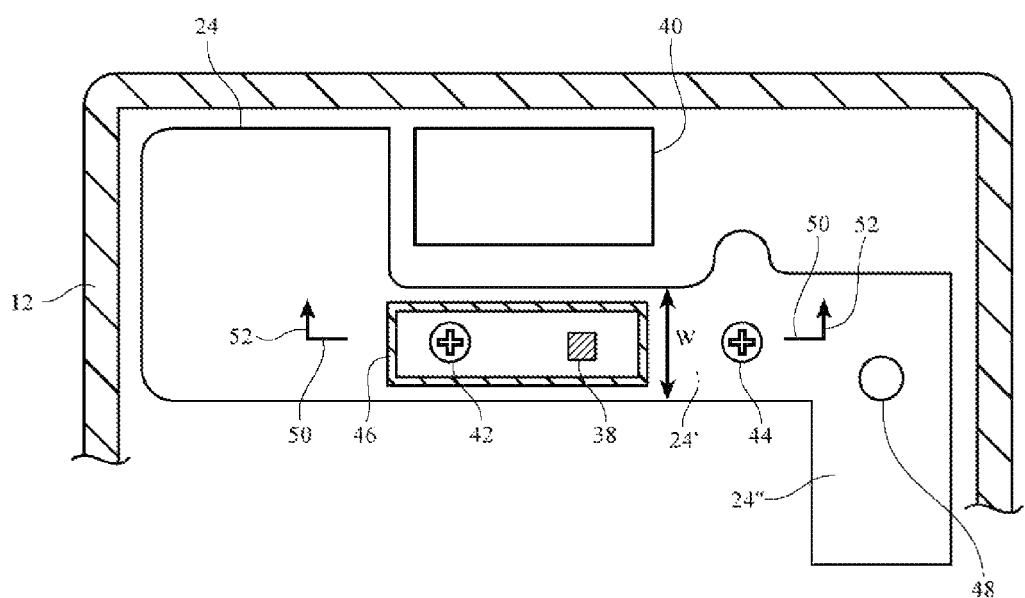
FIG. 4 is a top interior view of a portion of an electronic device in accordance with an embodiment.

To prevent damage to sensor 38, a ring-shaped member such as bumper 46 of FIG. 4 may surround sensor 38. Bumper 46 may be formed from metal or other suitable materials (e.g., plastic, glass, ceramic, an insulator covered with metal, combinations of these materials, etc.). As an example, bumper 46 may be a rectangular metal ring that is soldered to a metal trace on printed circuit 24 to attach bumper 46 to printed circuit 24. Ring-shaped bumpers inlay also be formed from other materials (e.g., plastic attached to printed circuit 24 using adhesive, screws or other fasteners, etc.).

Printed circuit 24 may have a shape that accommodates nearby components such as component 40. Sensor 38 may be mounted in region 24 of printed circuit 24. Additional components such as component 48 may be mounted in portions of printed circuit 24 such as portion 24". Component 48 may be a sensor such as a pressure sensor that makes ambient an pressure measurements of the an within the interior of device 10 and thus the surrounding atmosphere or may be any other electronic component 26.

Component 40 may be an audio component such as a speaker that operates through an opening in housing 12. Thermal sensor 38 may be mounted near component 40 at the end of housing 12 (e.g., under light-emitting diodes 22' of FIG. 4). Due to space constraints (e.g., the desired to mount printed circuit 24 in the vicinity of light-emitting diodes 22'. While accommodating speaker 40), the width W of printed circuit portion 24' may be relatively small in the vicinity of thermal sensor 38. Printed circuit 24 may be secured to housing 12 using screws such as screws 42 and 44 or other fasteners. Because printed circuit 24 may be relatively narrow in region 24' between screws 42 and 44, there may be a risk that printed circuit 24 will flex at points midway between screws 42 and 44 when stressed (e.g., during a drop event or other unexpected impact on device 10), even when printed circuit 24 is formed from a rigid printed circuit board material.

In the absence of bumper 46, flexing of printed circuit 24 could dislodge sensor 38 or cause other damage. In the presence of bumper 46, however, printed circuit 24 will be locally stiffened. This can strengthen printed circuit 24 in the vicinity of sensor 38 and help prevent sensor 38 from becoming dislodged. Stiffening of portion 24' of printed circuit 24 may be enhanced by laterally extending bumper 46 sufficiently to surround both thermal sensor 38 and printed circuit mounting structures such as screw 42, as shown in FIG. 4. Because screw 42 is attached to housing 12 or other sturdy support structure, printed circuit 24 will be stiff in the vicinity of screw 42. Bumper 46 helps extend this region of stiffness from screw 42 to the vicinity of sensor 38. If desired, bumper 46 may have a central opening that encompasses a region of primed circuit board 24 that contains multiple housing attachment points (e.g., screw 44 in additional to screw 4). The configuration of FIG. 4 in which bumper 46 surrounds a single attachment point (screw 42) and sensor 38 is merely illustrative.

Figure 5:
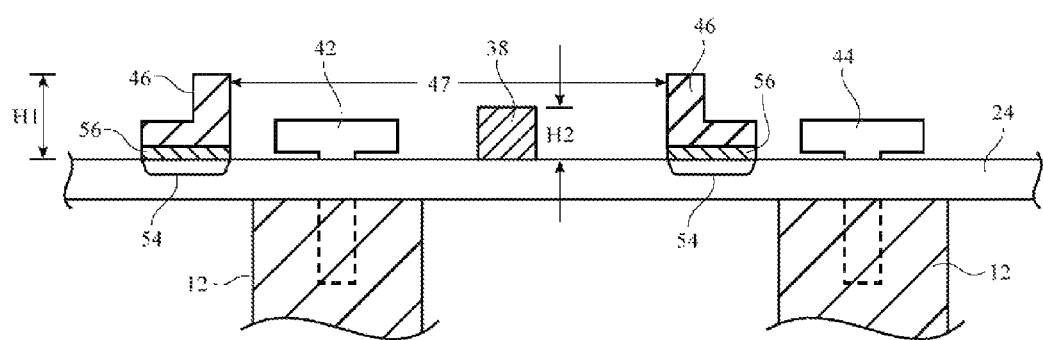
FIG. 5 is a cross-sectional side view of a portion of the electronic device of FIG. 4 in accordance with an embodiment.

FIG. 5 is a cross-sectional side view of printed circuit 24 of FIG. 4 taken along line 50 and viewed in direction 52. As shown in FIG. 5, printed circuit 24 may be mounted to a support structure such as housing 12 using screws such as screws 42 and 44 or other fasteners. Bumper 46, which may be mounted to metal traces (pads) on printed circuit 24 such as metal traces 54 using solder 56 may have an L-shaped cross-sectional shape or other suitable shape. Bumper 46 preferably has a height H1 above the upper surface of printed circuit 24 that is greater than the height H2 of sensor 38. When a portion of display 14 or other structures in device 10 are being inserted into housing 12 in the vicinity of sensor 38, the relatively tall height of bumper 46 can help prevent the display or other structures from contacting sensor 38. Opening 47 in the center of bumper 46 allows heat to be received by temperature sensor 38 during operation (e.g., heat from light-emitting diodes 22').

If desired, bumper 46 may be formed from multiple segments of material (e.g., two segments, three segments, etc.). In this type of configuration, bumper 46 may still surround and protect sensor 38, but will not transmit as much stillness from the vicinity of screw 42 to the vicinity of sensor 38 as generally takes place when bumper 46 is formed from a single continuous ring of metal. To enhance stiffness further, a stiffening sheet may be attached to the lower surface of printed circuit 24 under sensor 38. Bumper 46 and other structures that are solder to printed circuit 24 may be formed from solder compatible materials (e.g., nickel plated stainless steel, etc.).

Figure 6:
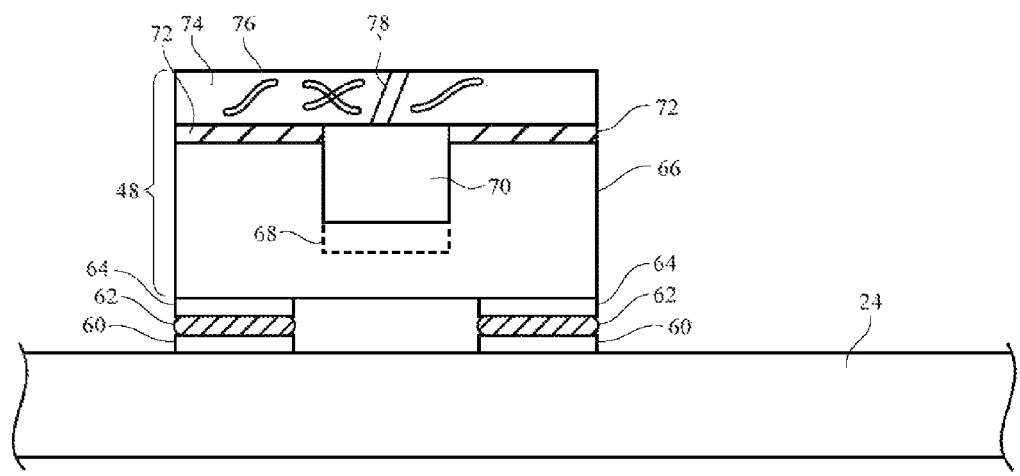
FIG. 6 is a cross-sectional side view of an illustrative electrical component with a porous port cover in accordance with an embodiment.

A cross-sectional side view of an illustrative component such as component 48 in region 24" of printed circuit 24 or other portion of printed circuit 24 is shown in FIG. 6. Component 48 may be a pressure sensor (e.g., a pressure sensor used as part of an altimeter or other device) or other internal electrical component that has a port such as port 70. During operation of device 10, there may sometimes be a risk of contaminants such as dust particles. These particles may be received from the exterior of device 10 (e.g., through an audio port or other port in housing 12) or may be generated internally (e.g., when internal parts rub against each other during normal use or during a drop event). Component 48 may be protected from dust particles using a porous layer such as porous port cover 74.

As shown in FIG. 6, sensor 48 may have contacts such as contacts 64 (e.g., positive and negative signal terminals, etc.). Contacts 64 may be soldered to metal traces 60 on printed circuit 24 using solder 62. Pressure sensor 48 may contain a pressure sensing device such as device 68 mounted in pressure sensor body 66 (e.g., a plastic package). Device 68 may be formed from a microelectromechanical systems (MEMS) device such as a micromachined silicon pressure sensing device. Pressure sensing device 68 may be mounted in enclosure 66. Enclosure 66, which may sometimes be referred to as a housing, body, package, or case, may be formed from a single structure or multiple structures. Materials such as plastic, metal, ceramic, and glass may be used in forming one or more structures in enclosure 66. Enclosure 66 may be a surface mount technology package or other suitable enclosure.

Enclosure 66 may have one or more openings to the air surrounding enclosure 66 forming a port for pressure sensor 48, port 70 may be aligned with pressure sensing device 68. This allows device 68 to be exposed to the surrounding environment so that pressure measurements may be obtained. Pressure sensor 48 may, for example, make ambient pressure sensor measurements through port 70 using pressure sensing device 68.

To prevent dust or other contaminants from entering port 70, port 70 may include porous material 74. For example, a layer of porous material 74 may cover enclosure 66 and device 68 (i.e., port 70 may be covered with porous material). Porous material 74 may be a fabric having fibers 76, may be an open cell plastic foam, may be a layer of metal or polymer in which openings have been formed using chemical etching, laser etching, machining, or other techniques, or may be other porous layer of material. As shown in FIG. 6 porous layer 74 may have pores (microscopic openings) such as pore 78. Pores 78 may be sufficiently large to allow air pressure changes to be readily conveyed to pressure sensing device 68 through port 70 while simultaneously being sufficiently small to block dust particles and thereby prevent contaminants from entering port 70. As an example, pores 78 may have diameters of greater than 5 microns, greater than 10 microns, 5-20 microns, less than 25 microns, less than 50 microns, etc.).

Porous layer 72 serves as a dust blocking layer and therefore may sometimes be referred to as a port cover, dust blocking cover, or dust blocking port structure. Porous layer 72 may be attached to enclosure 66 or may be formed as an integral portion of some or all of the structures of enclosure 66.

As shown in FIG. 6, adhesive 72 may, if desired, be used to attach porous layer 74 to enclosure (body) 66 of sensor 48. Port 70 may have an opening that is circular or rectangular or that has other opening shapes. Adhesive 72 may have a ring shape that surrounds port 70. For example, adhesive 72 may have the shape of a circular ring, a rectangular ring, a rectangular patch with a circular opening for port 70, or other ring shape. By surrounding opening 70, adhesive 72 may help ensure that a satisfactory seal is provided between porous layer 72 and body 66 of sensor 48 around the periphery of layer 72. Other attachment mechanisms may be used for attaching dust blocking port covers such as porous layer 74 if desired. For example, screws, springs, clamping structures, or other attachment mechanisms may be used to attach porous layer 72 to body 66.

Figure 8:
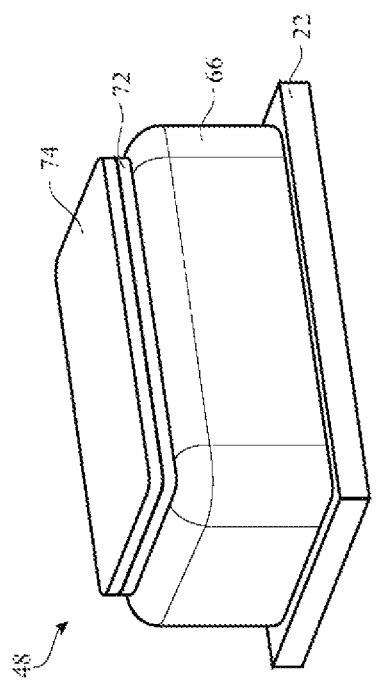
FIG. 8 is an assembled perspective view of the illustrative electronic component of FIG. 7 in accordance with an embodiment.
Figure 7:
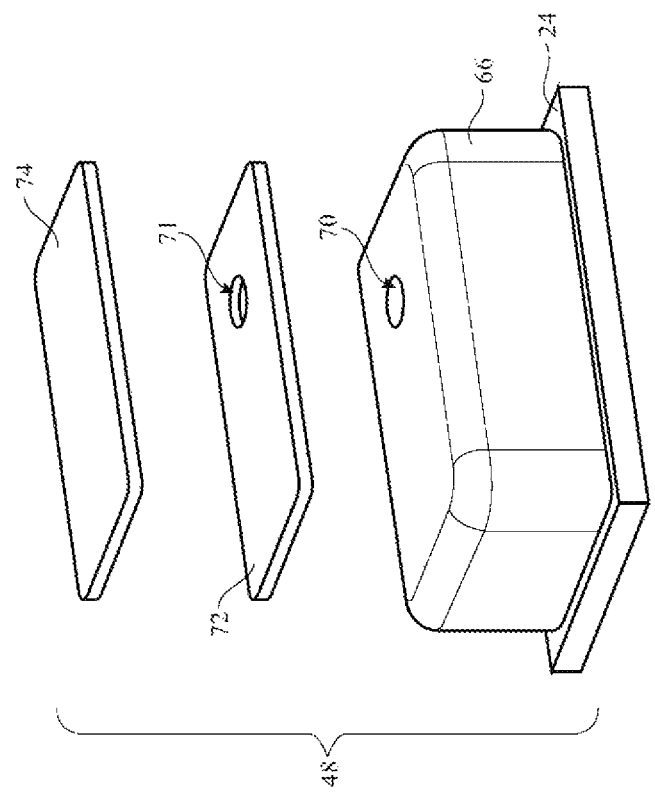
FIG. 7 is an exploded perspective view of an illustrative electronic component with a porous port cover in accordance with an embodiment.

A perspective view of pressure sensor 48 in an illustrative configuration in which adhesive 72 has a rectangular shape is shown in FIG. 7. As shown in FIG. 7, the upper surface of enclosure 66 has a rectangular shape with a circular port opening for port 70. Adhesive 71 has a corresponding circular opening such as opening 71 in alignment with the circular enclosure opening. Porous layer 72 has a rectangular shape that overlaps openings 71 and 70. The rectangular shape of adhesive layer 72 serves to attach rectangular porous layer 74 to the upper rectangular surface of enclosure (body) 66 of pressure sensor 48. FIG. 8 is an assembled perspective view of pressure sensor 48 formed from the structures of FIG. 7.

FIG. 9 is a perspective view of pressure sensor 48 in an illustrative configuration in which port 70 has a cluster of holes 78. Holes 78 may be perforations having sizes of less than 500 microns, less than 200 microns, less than 40 microns, less than 10 microns, or more than microns (as examples). Holes (pores) such as holes 78 of FIG. 9 may sometimes be referred to as microperforations and may be sized to prevent dust from entering sensor 48 while permitting air to enter sensor 48 for pressure measurements. Holes 78 may be formed by laser drilling, micromachining, or other techniques. FIG. 10 is an interior perspective view of the surface of a structure in enclosure 66 showing how holes 78 may pass through enclosure 66. In the illustrative configuration of FIG. 11, portion 79 of enclosure structure 66 may be locally thinned to facilitate formation of holes 78.

Figure 12:
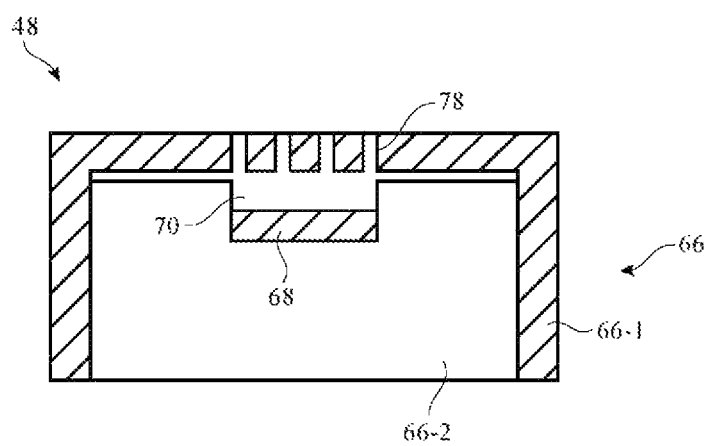
FIG. 12 is a cross-sectional side view of an illustrative electronic component with perforations of the type shown in FIG. 9 in accordance with an embodiment.

FIG. 12 is a cross-sectional side view of enclosure 66 in an illustrative configuration in which enclosure 66 has multiple enclosure structures such as inner portion 66-2 in which device 68 is mounted and outer portion 66-1 in which openings 78 have been formed. Enclosure 66 may, in general, be formed from one structural member, from two or more separate structures that are joined using press-fitting attachment techniques, using adhesive, using screws, using laser welding, using ultrasonic welding, or using other assembly techniques. The configuration of FIG. 12 is merely illustrative.

Figure 14:
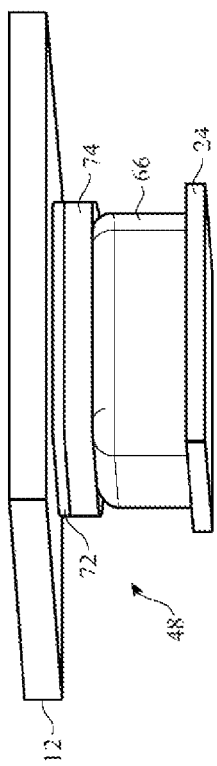
FIG. 14 is an assembled perspective view of the illustrative electronic component of FIG. 13 in accordance with an embodiment.
Figure 13:
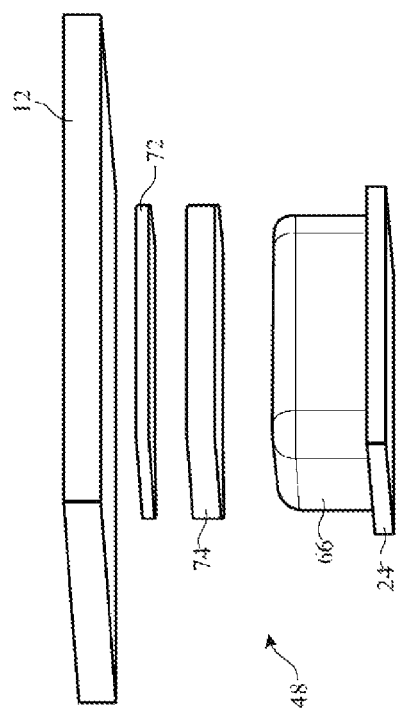
FIG. 13 is an exploded perspective view of an illustrative electronic component with a port cover structure formed from foam in accordance with an embodiment.

As shown in the exploded perspective view of FIG. 13, pressure sensor 48 may be provided with a porous dust blocking structure by using adhesive 72 to attach porous layer 74 to device housing 12 or to other structure besides enclosure 66. Additional adhesive may attach layer 74 to enclosure 66, if desired. In the configuration of FIG. 13, adhesive layer 72 is being used to attach a compressible porous layer such as a layer of spongy fabric or an open-celled elastomeric foam to the inner surface of a support structure such as device housing 12. Port 70 of sensor enclosure 66 on printed circuit 24 is pressed against layer 74 to compress layer 74 between enclosure 66 and housing 12, as shown in the assembled view of FIG. 14. Air enters port 70 in the upper surface of enclosure 66 through pores 78 in layer 74 that are open to air around the exposed edges (side walls) of layer 74 (i.e., area of the wall of housing 12 that overlaps adhesive layer 72 and layer 74 and that is in alignment with port 70 may be devoid of openings). In this way, air pressure measurements may be made internally within device 10 without exposing port 70 to excessive dust.

During a drop event, during normal use of device 10, or during other activities, stresses may be produced in printed circuit 24 that have a potential for damaging printed circuit 24 and/or components 26. The risk of damage may be reduced by using screws (e.g., screws 42 and 44 or other screws) to securely attach printed circuit 24 to housing 12 or other support structures in device 10.

Figure 15:
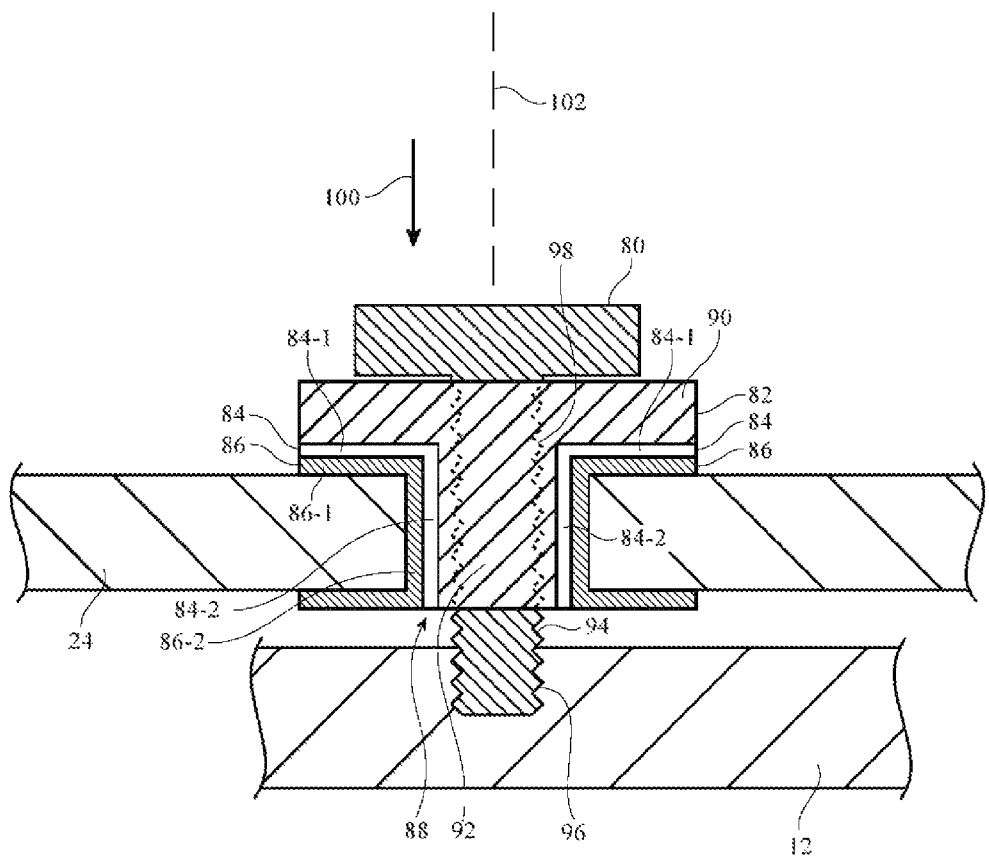
FIG. 15 is a cross-sectional side view of an illustrative standoff of the type that may be used in securing a printed circuit in an electronic device housing in accordance with an embodiment.

A standoff such as standoff 82 of FIG. 15 may be used in strengthening printed circuit 24 in the vicinity of a screw attachment point. As shown in FIG. 15, standoff 82 may have an opening such as opening 98. Opening 98 may be unthreaded or threaded. As an example, opening 98 may be threaded and threaded shaft 94 of screw 80 may screw into threaded opening 98. After screwing through standoff 82, threaded shaft 94 may screw into threaded opening 9 in a support structure within device 10 such as housing 12. Standoff 82 may be attached to printed circuit 24, so by using screw 80 to attach standoff 82 to housing 12, printed circuit 24 will be attached to housing 12.

Standoff 82 may have a wider upper portion such as head 90 and a narrower lower portion such as shaft 92. Head 90 and shaft 92 may be cylindrical or may have other suitable shapes. During assembly, standoff 82 may be inserted into opening 88 in printed circuit 24 by moving standoff 82 in direction 100 along longitudinal axis 102 of standoff 82 and opening 88.

Standoff 82 may be formed from a solder compatible metal or a metal that is coated with nickel or other solder compatible metal. Opening 88 may be through hole in printed circuit 24 that is coated with metal 86 (e.g., opening 88 may be a plated through hole that is coated with metal 86 that is electroplated onto primed circuit 24). Some of metal 86 such as sidewall metal portion 86-2 may coat the cylindrical inner surface of opening 88 (i.e., the sidewalls of opening 88). Other portions of metal 86 such as ring-shaped upper surface metal portion 86-1 may cover some of the surface of printed circuit 24 surrounding opening 88.

Solder 84 may be used to attach standoff 82 to printed circuit 24. Surface portion 84-1 of solder 84 may be used to attach the lower surface of head 90 of standoff 82 to metal 86-1 on the surface of printed circuit 24. Through hole portion 84-2 of solder 84 may be used to attach shaft 92 of standoff 82 to the metal portion coating the inner walls of opening 88 (i.e., metal 86-2). By employing both solder on the surface of printed circuit 24 and solder within the through hole 88 in printed circuit 24, standoff 82 may be securely fastened to printed circuit 24. This allows printed circuit 24 and components 26 on printed circuit 24 such as sensors 38 and 48 to be securely mounted to housing 12.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
   a printed circuit having opposing first and second surfaces;
   a sensor mounted to the first surface of the printed circuit, wherein the sensor extends from the printed circuit board to a first height;
   a fastener that secures the printed circuit to a support structure, wherein the fastener is separate from the sensor and wherein the support structure is coupled to the second surface of the printed circuit board; and
   a ring-shaped bumper coupled to the first surface of the printed circuit board that surrounds the sensor and the fastener, wherein the ring-shaped bumper extends from the printed circuit board to a second height that is greater than the first height.

2. The apparatus defined in claim 1 wherein the ring-shaped bumper comprises a metal ring that is soldered to the printed circuit.

3. The apparatus defined in claim 2 wherein the sensor comprises a thermal sensor.

4. The apparatus defined in claim 3 wherein the bumper encloses a region of the printed circuit and wherein the apparatus further comprises a pressure sensor mounted to the printed circuit outside of the region.

5. The apparatus defined in claim 4 wherein the pressure sensor comprises a pressure sensing device mounted in a sensor body in alignment with an opening in the body through which the pressure sensing device senses ambient air pressure.

6. The apparatus defined in claim 5 further comprising a dust blocking layer that is attached to the sensor body over the opening.

7. The apparatus defined in claim 6 wherein the dust blocking layer comprises a porous layer selected from the group consisting of: a fabric, a sheet with openings, and an open-celled foam.

8. The apparatus defined in claim 7 wherein the printed circuit is attached to an electronic device housing using a standoff.

9. The apparatus defined in claim 8 wherein the printed circuit has opposing first and second surfaces and a through hole that passes between the first and second surfaces, wherein the standoff has a head that is soldered to metal on the first surface, and wherein the standoff has a shaft that is soldered to metal in the through hole.

10. The apparatus defined in claim 9 wherein the printed circuit comprises a rigid printed circuit board and wherein the thermal sensor is soldered to metal traces on the rigid printed circuit board.

11. The apparatus defined in claim 10 further comprising a display having light-emitting diodes, wherein the thermal sensor measures heat from the light-emitting diodes through a central opening in the bumper.

12. Apparatus, comprising:
    a housing having an interior;
    a display mounted in the housing;
    a printed circuit board mounted within the interior of the housing, wherein the printed circuit board has opposing first and second surfaces;
    a fastener that secures the printed circuit board to a support structure, wherein the fastener is mounted to the printed circuit board at a first attachment point and wherein the support structure is coupled to the second surface of the printed circuit board;
    a ring-shaped bumper mounted to the first surface of the printed circuit board, wherein the fastener is surrounded by the ring-shaped bumper and wherein the ring-shaped bumper extends from the printed circuit board to a first height; and
    a thermal sensor secured to the printed circuit board at a second attachment point that is different from the first attachment point, wherein the thermal sensor is surrounded by the ring-shaped bumper and wherein the thermal sensor extends from the printed circuit board to a second height that is less than the first height.

13. The apparatus defined in claim 12 wherein the ring-shaped bumper is soldered to the printed circuit board.

14. The apparatus defined in claim 12 wherein the fastener is a first screw.

15. The apparatus defined in claim 14 wherein the printed circuit board is fastened to the support structure using a second screw.

16. The apparatus defined in claim 12 further comprising an additional electronic component mounted on the printed circuit board.

17. The apparatus defined in claim 12 wherein the ring-shaped bumper is a rectangular metal ring that is soldered to a metal trace on the printed circuit board.

18. The apparatus defined in claim 12 wherein the ring-shaped bumper comprises plastic and wherein the ring-shaped bumper is attached to the printed circuit board using an adhesive.

19. The apparatus defined in claim 12 wherein the ring-shaped bumper comprises an opening and wherein the thermal sensor is located in the opening.

\* \* \* \* \*